(12) United States Patent
Wang et al.

(10) Patent No.: US 12,382,579 B2
(45) Date of Patent: Aug. 5, 2025

(54) STRETCHABLE CIRCUIT BOARD ASSEMBLY AND METHOD FOR MANUFACTURING THE SAME

(71) Applicants: HongQiSheng Precision Electronics (QinHuangDao) Co.,Ltd., Qinhuangdao (CN); Avary Holding (Shenzhen) Co., Limited., Shenzhen (CN); GARUDA TECHNOLOGY CO., LTD., New Taipei (TW)

(72) Inventors: Chao Wang, Qinhuangdao (CN); Xiao-Juan Zhang, Qinhuangdao (CN); Chang-He Zhu, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN); GARUDA TECHNOLOGY CO .. LTD., New Taipei (TW)

( * ) Notice: Subject to any disclaimer, the term of this patent is extended or adjusted under 35 U.S.C. 154(b) by 211 days.

(21) Appl. No.: 18/372,376

(22) Filed: Sep. 25, 2023

(65) Prior Publication Data
US 2025/0071890 A1    Feb. 27, 2025

(30) Foreign Application Priority Data

Aug. 22, 2023  (CN) .......................... 202311061846.1

(51) Int. Cl.
| | |
|---|---|
| H05K 1/02 | (2006.01) |
| H05K 1/16 | (2006.01) |
| H05K 3/10 | (2006.01) |

(52) U.S. Cl.
CPC .......... *H05K 1/0283* (2013.01); *H05K 1/028* (2013.01); *H05K 1/165* (2013.01); *H05K 3/107* (2013.01); *H05K 2201/086* (2013.01); *H05K 2201/09036* (2013.01)

(58) Field of Classification Search
CPC ...... H05K 1/0283; H05K 1/028; H05K 3/107; H05K 2201/09036; H05K 3/361; H05K 1/147
See application file for complete search history.

(56) References Cited

U.S. PATENT DOCUMENTS

2020/0146150 A1* 5/2020 Nagamine ................ H05K 3/22

FOREIGN PATENT DOCUMENTS

TW            201709778 A        3/2017

* cited by examiner

*Primary Examiner* — Sherman Ng
(74) *Attorney, Agent, or Firm* — ScienBiziP, P.C.

(57) ABSTRACT

A stretchable circuit board assembly and a method for manufacturing the same are provided. The circuit board assembly includes a flexible circuit board and an outer circuit board. The flexible circuit board includes a first base layer and an inner wiring layer. The flexible circuit board is divided into a connecting area and a stretchable area. The inner wiring layer within the connecting area includes an electrical connecting portion exposed from the outer circuit board. The stretchable area is configured to deform into at least one bent portion. The bent portion is used to cause the electrical connecting portion to stretch relative to the outer circuit board. The outer circuit board includes a second base layer and an outer wiring layer. A surface of the second base layer away from the outer wiring layer defines at least one blind groove. The blind groove is configured to receive the bent portion.

20 Claims, 21 Drawing Sheets

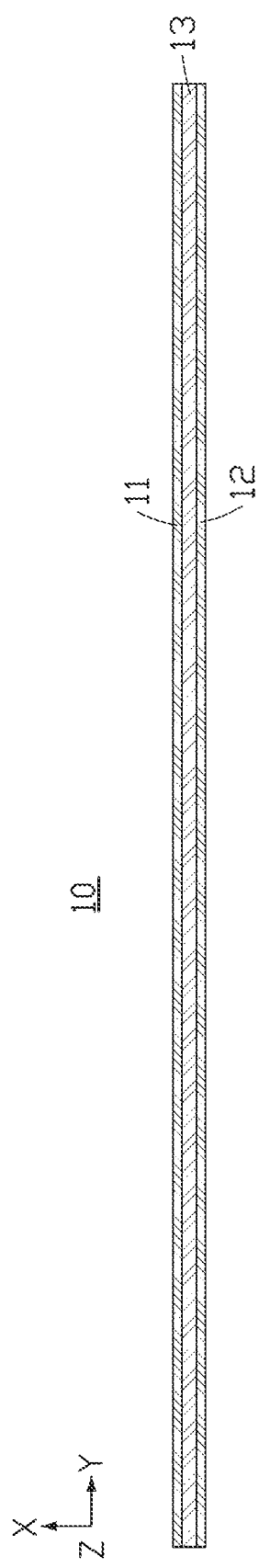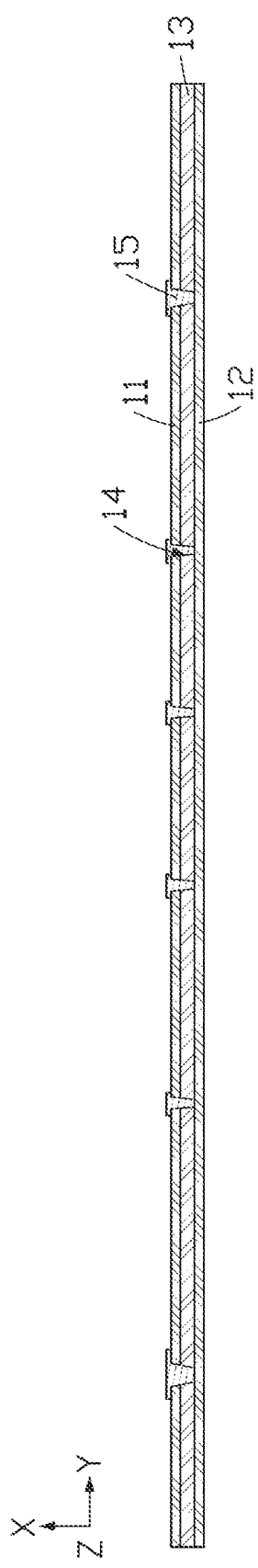

STRETCHABLE CIRCUIT BOARD ASSEMBLY AND METHOD FOR MANUFACTURING THE SAME

FIELD

The subject matter herein generally relates to circuit boards, and more particularly, to a stretchable circuit board assembly and a method for manufacturing the circuit board assembly.

BACKGROUND

At present, people have paid great attention to rollable display technology.

Flexible circuit boards are used in electronic products. Such an electronic product may also include a display screen and a motherboard. The display screen is electrically connected to the mother board through the flexible circuit board, thereby controlling the display screen or transmitting a signal to the display screen. However, the flexible circuit board cannot be stretched and thus cannot control the display screen connected thereto to stretch. Thus, the existing flexible circuit board cannot be used in a rollable display screen.

Therefore, there is room for improvement within the art.

BRIEF DESCRIPTION OF THE DRAWINGS

Implementations of the present disclosure will now be described, by way of embodiments, with reference to the attached figures.

FIG. 1 is a cross-sectional view illustrating a first copper-clad substrate according to an embodiment of the present application.

FIG. 2 is a cross-sectional view illustrating a first conductive portion being formed in the first copper-clad substrate in FIG. 1.

DETAILED DESCRIPTION

Figure 3:
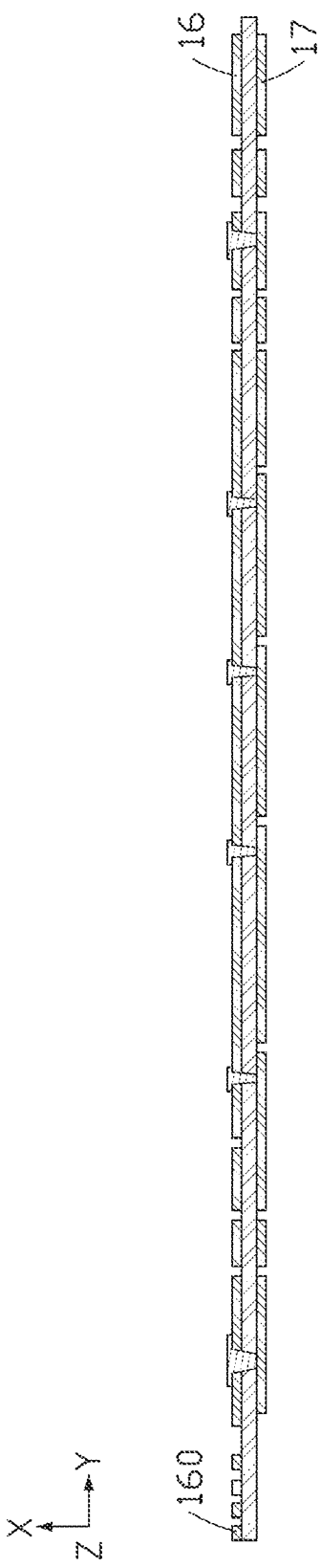
FIG. 3 is a cross-sectional view illustrating a metal layer of the first copper-clad substrate in FIG. 2 being etched to obtain an inner wiring layer.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to;" it specifically indicates open-ended inclusion or membership in the so-described combination, group, series, and the like.

Figure 25:
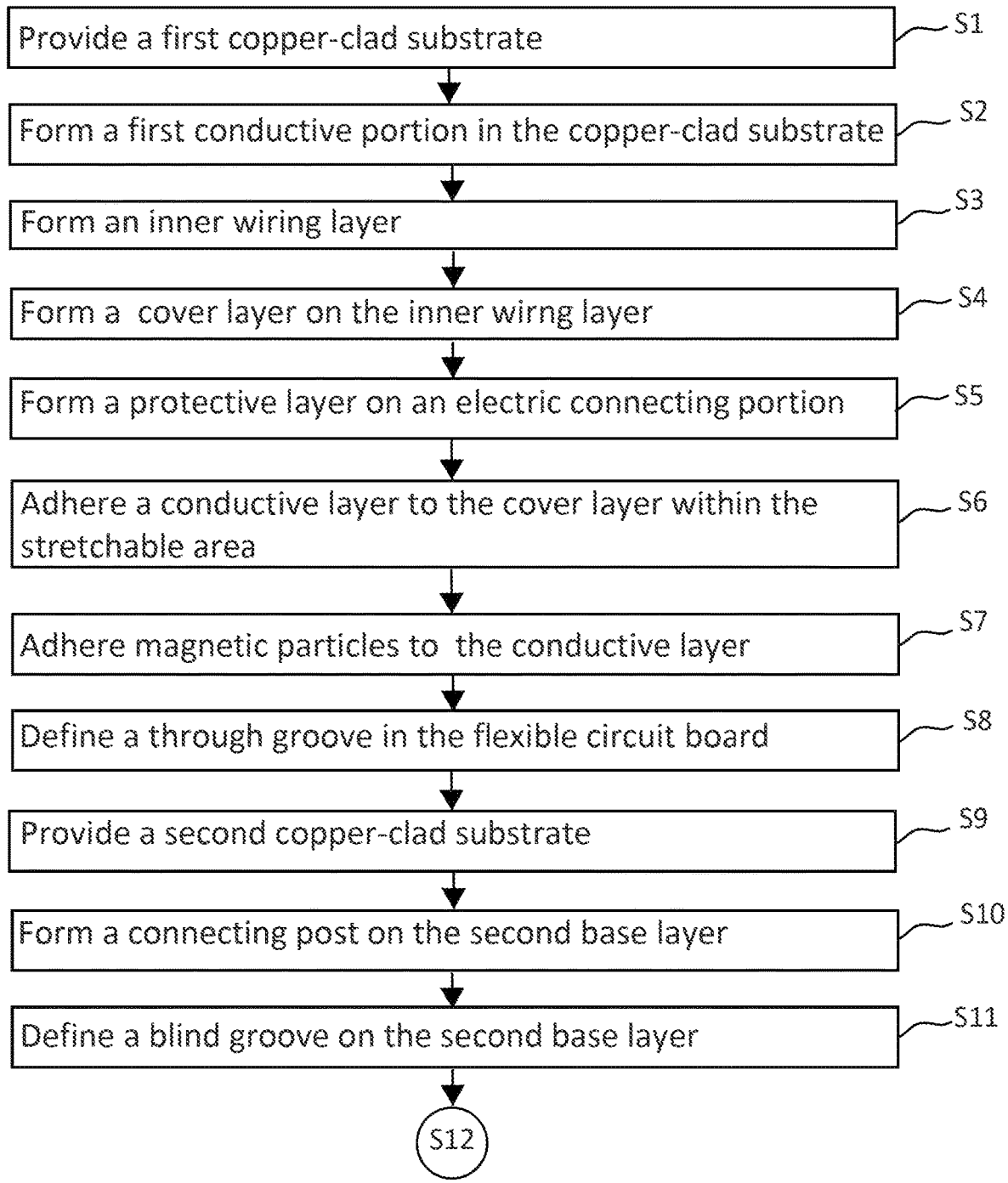
FIGS. 25 and 26 are flowcharts illustrating a method for manufacturing a circuit board assembly according to an embodiment of the present application.
Figure 26:
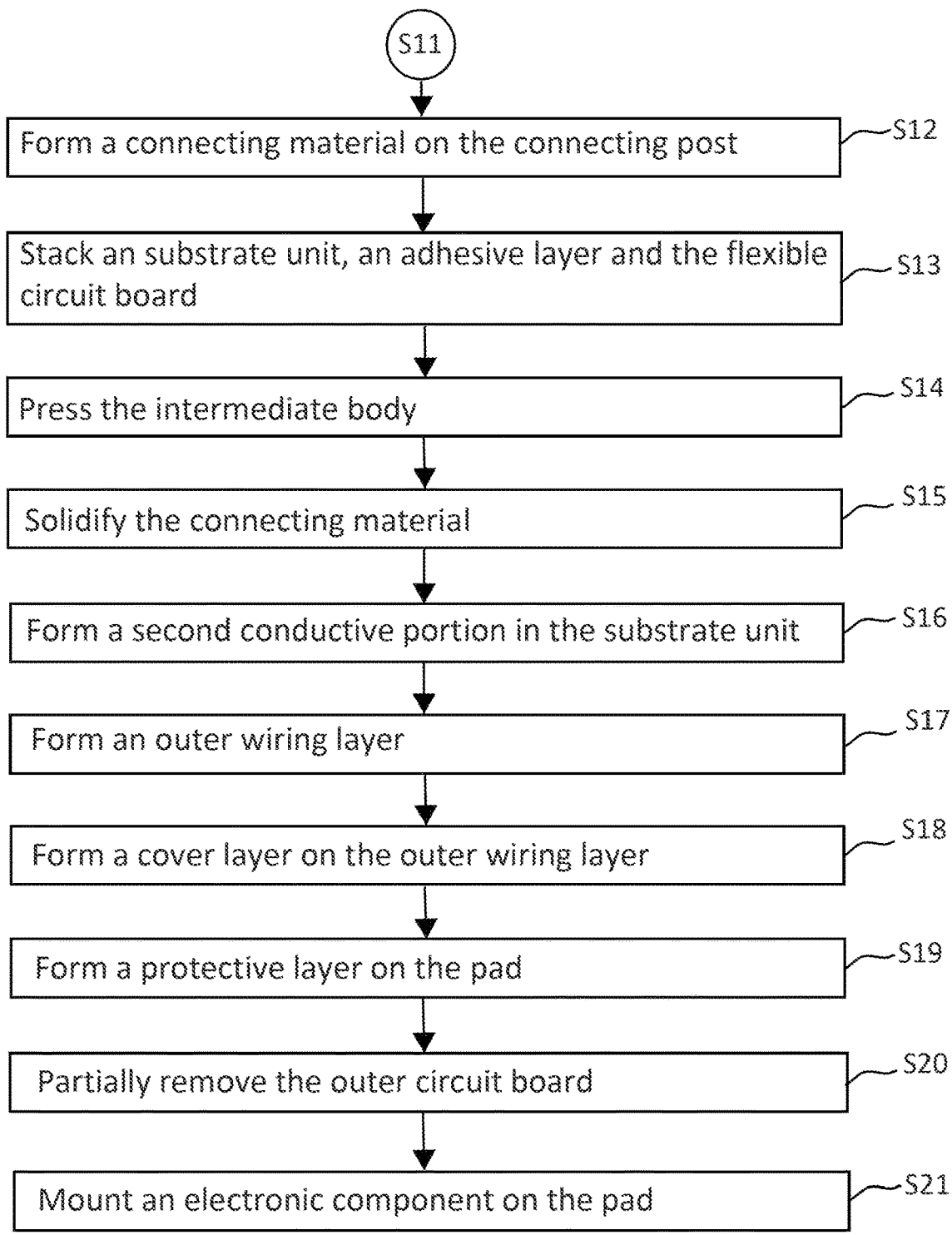

FIGS. 25 and 26 illustrate flowcharts of a method for manufacturing a circuit board assembly in accordance with an embodiment. The method is provided by way of embodiments, as there are a variety of ways to carry out the method. Each block shown in FIG. 25 represents one or more processes, methods, or subroutines carried out in the method. Furthermore, the illustrated order of blocks can be changed. Additional blocks may be added or fewer blocks may be utilized, without departing from this disclosure. The method can begin at block S1.

At block S1, referring to FIG. 1, a first copper-clad substrate 10 is provided. The first copper-clad substrate 10 includes a first metal layer 11, a first base layer 13, and a second metal layer 12 sequentially stacked in a first direction X.

In at least one embodiment, the first base layer 13 is made of an insulating resin. For example, the insulating resin may be selected from epoxy resin, polyphenylene oxide (PPO), polyimide (PI), polyethylene terephthalate (PET), polyethylene naphthalate (PEN), and any combination thereof.

In at least one embodiment, the first metal layer 11 and the second metal layer 12 are made of copper.

At block S2, referring to FIG. 2, a first blind hole 14 is defined in the first copper-clad substrate 10. Metal is then electroplated in the first blind hole 14 to obtain a first conductive portion 15. The first conductive portion 15 electrically connects the first metal layer 11 to the second metal layer 12.

In at least one embodiment, the first blind hole 14 extends through the first metal layer 11 and the first base layer 13. The second metal layer 12 serves as a bottom of the first blind hole 14. The first conductive portion 15 may be made of copper.

In at least one embodiment, the first blind hole 14 may be formed by mechanical drilling or laser drilling.

At block S3, referring to FIG. 3, the first metal layer 11 is etched to obtain a first inner wiring layer 16. The second metal layer 12 is etched to obtain a second inner wiring layer 17. The first inner wiring layer 16 includes an electrical connecting portion 160. The electrical connecting portion 160 is used to allow the circuit board assembly 1 to connect to an external component (such as a display screen or a motherboard of an electronic product, not show).

In at least one embodiment, the first metal layer 11 and the second metal layer 12 may be etched by an exposure and development process.

In at least one embodiment, the electrical connecting portion 160 may include gold fingers.

Figure 4:
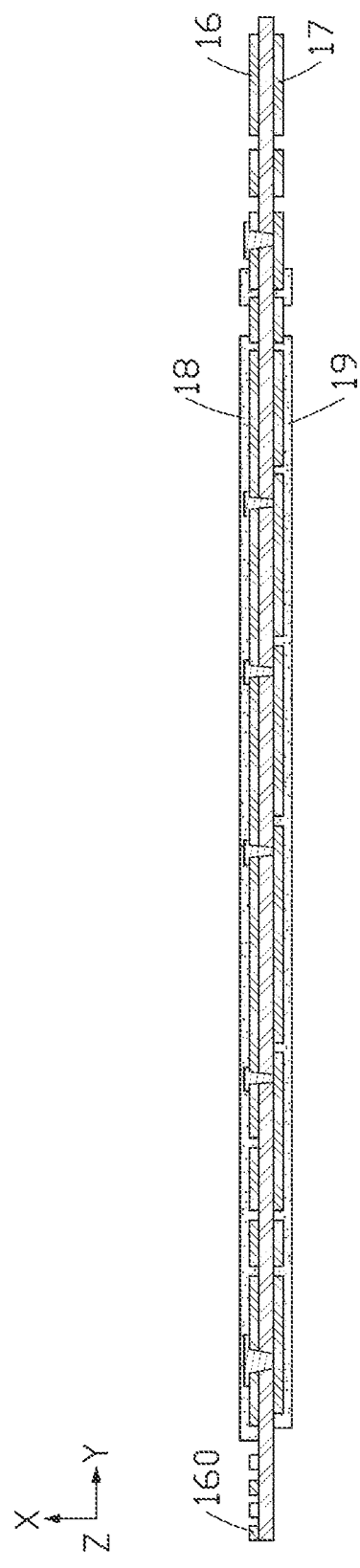
FIG. 4 is a cross-sectional view illustrating a cover layer being formed on the inner wiring layer in FIG. 3.

At block S4, referring to FIG. 4, a first cover layer 18 is formed on the first inner wiring layer 16. A second cover layer 19 is formed on the second inner wiring layer 17. The electrical connecting portion 160 is exposed from the first cover layer 18, namely, the first cover layer 18 does not cover the electrical connecting portion 160.

In at least one embodiment, each of the first cover layer 18 and the second cover layer 19 may be a cover film (CVL) or a solder mask layer.

Figure 5:
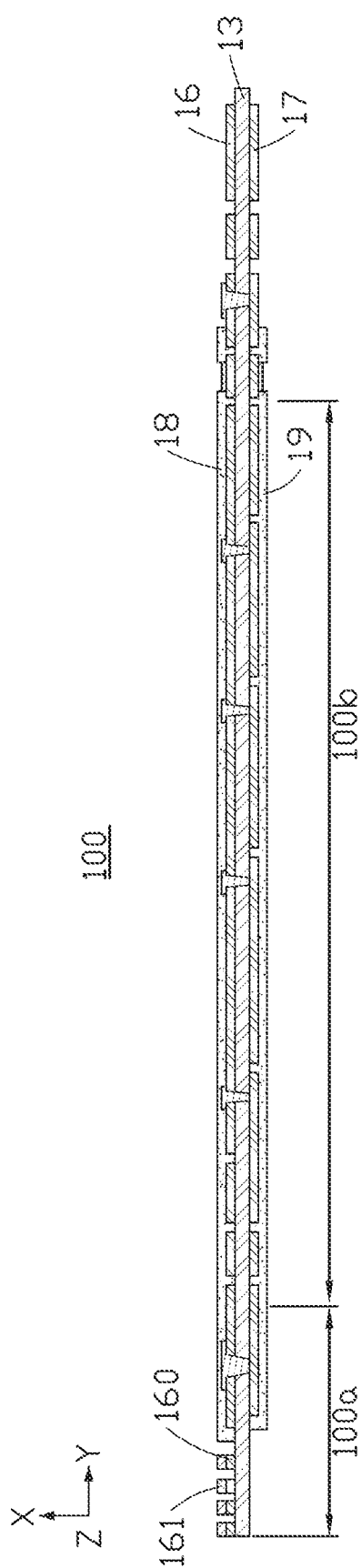
FIG. 5 is a cross-sectional view illustrating a protective layer being formed on the inner wiring layer in FIG. 4 to obtain a flexible circuit board.

At block S5, referring to FIG. 5, a surface treatment is performed on the electrical connecting portion 160 to form a first protective layer 161. Then, a flexible circuit board 100 is obtained. The flexible circuit board 100 includes a connecting area 100a and a stretchable area 100b. The connecting area 100a and the stretchable area 100b are connected in a second direction Y perpendicular to the first direction X. The first inner wiring layer 16 within the connecting area 100a includes the electrical connecting portion 160.

The first protective layer 161 is used to avoid surface oxidation happened on the electrical connecting portion 160, thereby ensuring the electrical performance of the electrical connecting portion 160. The surface treatment may be performed by chemical plating of gold or nickel. In other embodiments, the first protective layer 161 may also be an organic solder protective layer (OSP).

In the above embodiment, the flexible circuit board 100 includes two wiring layers, that is, the first inner wiring layer 16 and the second inner wiring layer 17. In other embodiments, the number of the wiring layer(s) included in the flexible circuit board 100 may be varied.

Figure 6:
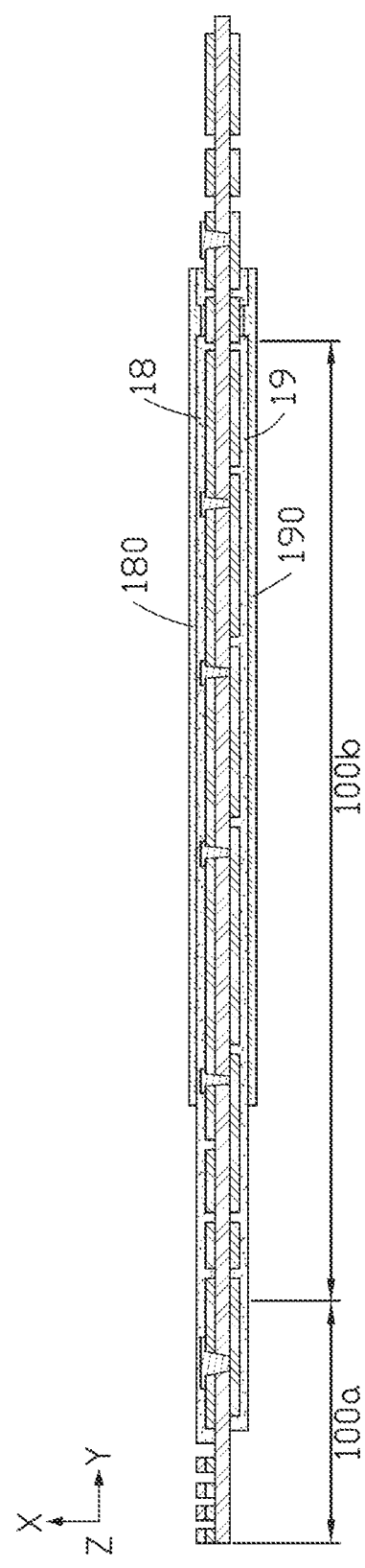
FIG. 6 is a cross-sectional view illustrating a conductive layer formed on the inner wiring layer in FIG. 5.

At block S6, referring to FIG. 6, a first conductive layer 180 is adhered to the first cover layer 18 within the stretchable area 100b. A second conductive layer 190 is adhered to the second cover layer 19 within the stretchable area 100b.

In at least one embodiment, the first conductive layer 180 and the second conductive layer 190 may be conductive fabrics.

Figure 7:
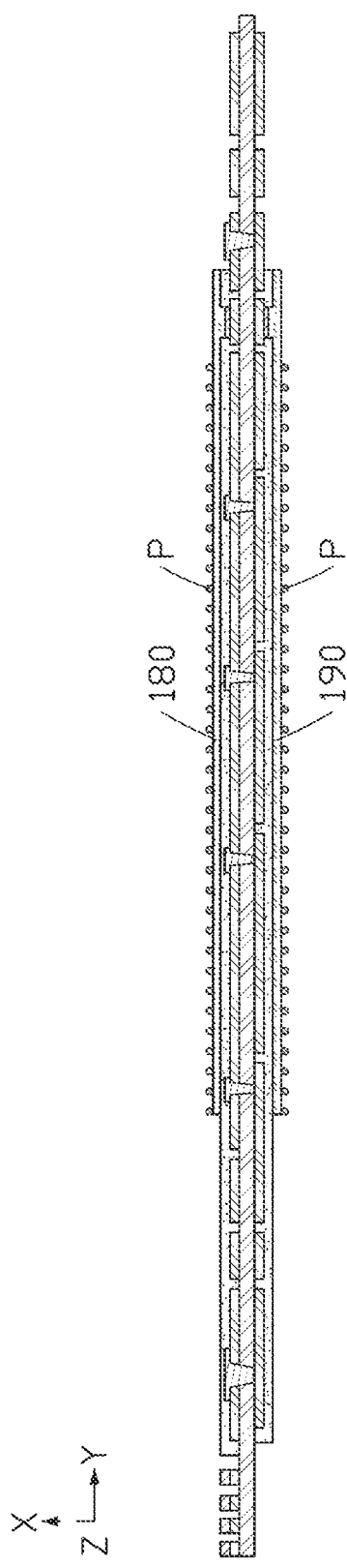
FIG. 7 is a cross-sectional view illustrating multiple magnetic particles being adhered to the conductive layer in FIG. 6.

At block S7, referring to FIG. 7, multiple magnetic particles P are adhered to each of the first conductive layer 180 and the second conductive layer 190.

In at least one embodiment, the magnetic particle P may be made of a magnet, a magnetic metal (such as iron, nickel, cobalt, and their alloys), or a ferrite (i.e., magnetic ceramics).

Figure 8A:
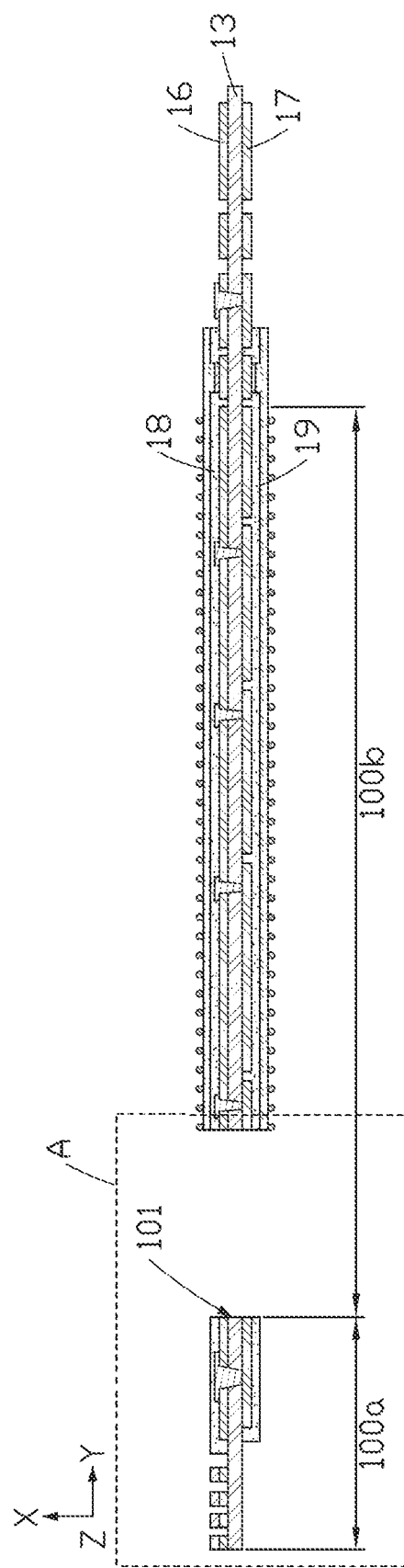
FIG. 8A is a cross-sectional view illustrating a through groove being defined in the flexible circuit board in FIG. 7.

At block S8, referring to FIG. 8A, at least one through groove 101 is defined in the flexible circuit board 100. Each through groove 101 is at least partially located in the stretchable area 100b.

Figure 8B:
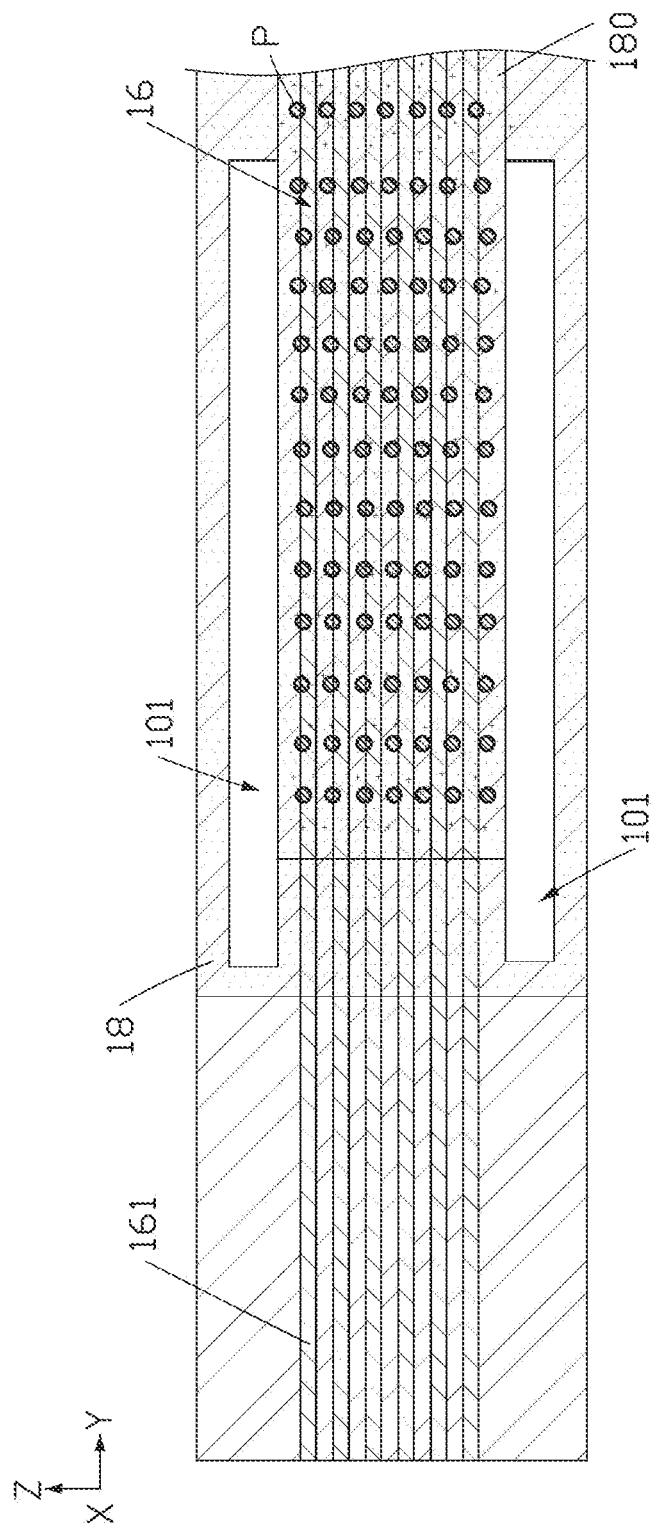
FIG. 8B is a top view illustrating a portion A of the flexible circuit board in FIG. 8A.

Each through groove 101 extends through the first base layer 13, and may also extend through the first cover layer 18 and the second cover layer 19 in some embodiments. Referring to FIG. 8B, the through groove 101 is spaced from the first inner wiring layer 16 and the second inner wiring layer 17. The through groove 101 may be formed by mechanical drilling.

Figure 9:
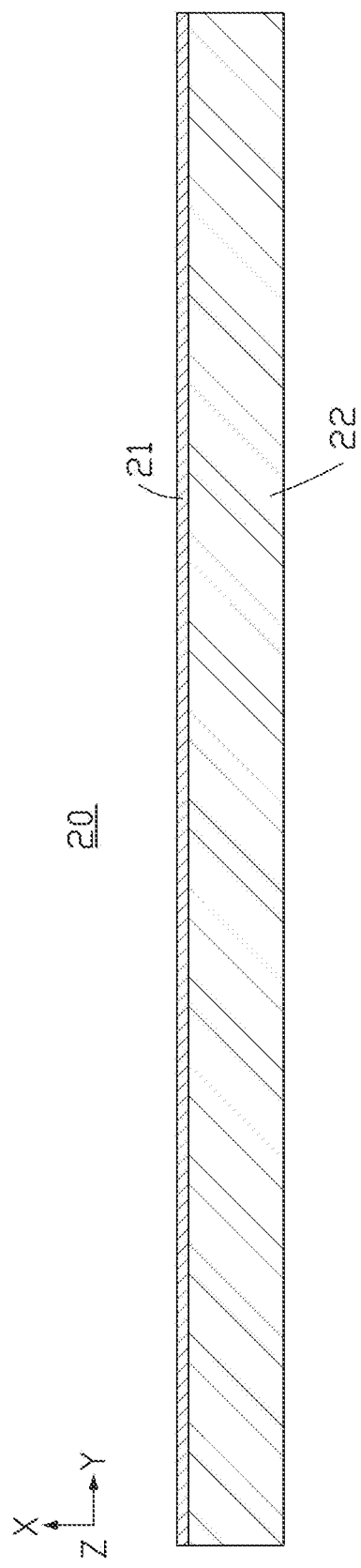
FIG. 9 is a cross-sectional view illustrating a second copper-clad substrate according to an embodiment of the present application.

At block S9, referring to FIG. 9, a second copper-clad substrate 20 is provided. The second copper-clad substrate 20 includes a third metal layer 21 and a second base layer 22 stacked in the first direction X.

In at least one embodiment, the second base layer 22 may be made of an insulating resin. For example, the insulating resin may be selected from epoxy resin, polyphenylene oxide (PPO), polyimide (PI), polyethylene terephthalate (PET), polyethylene naphthalate (PEN), and any combination thereof.

In at least one embodiment, the third metal layer 21 may be made of copper.

Figure 10:
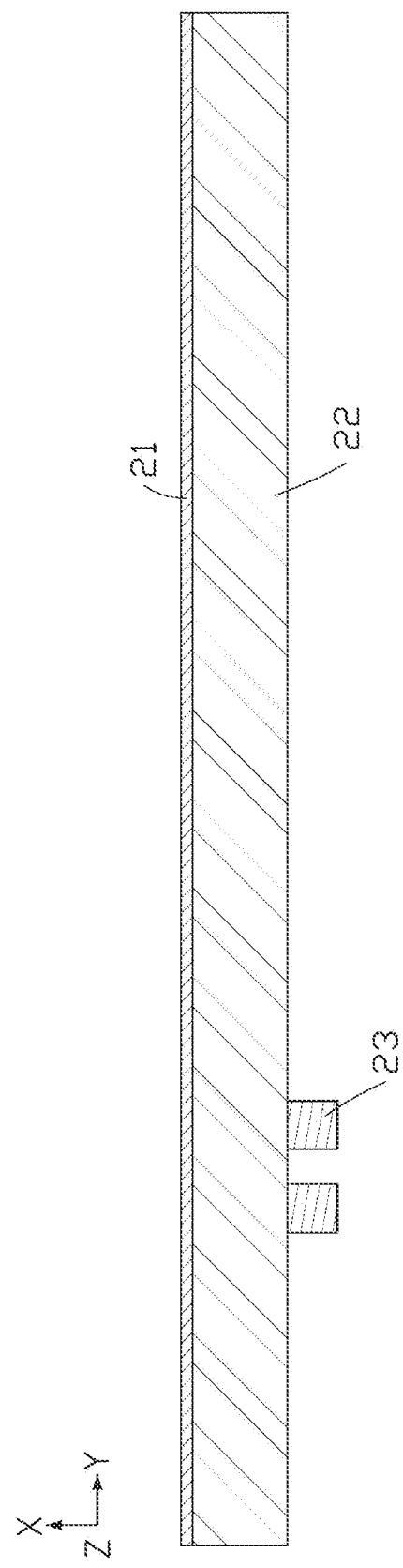
FIG. 10 is a cross-sectional view illustrating a connecting post being formed on the second copper-clad substrate in FIG. 9.

At block S10, referring to FIG. 10, at least one connecting post 23 is formed on a surface of the second base layer 22 away from the third metal layer 21.

In at least one embodiment, the connecting post 23 may be formed by metal electroplating. The connecting post 23 made by made of copper. In at least one embodiment, multiple connecting posts 23 are formed on the second base layer 22.

Figure 11:
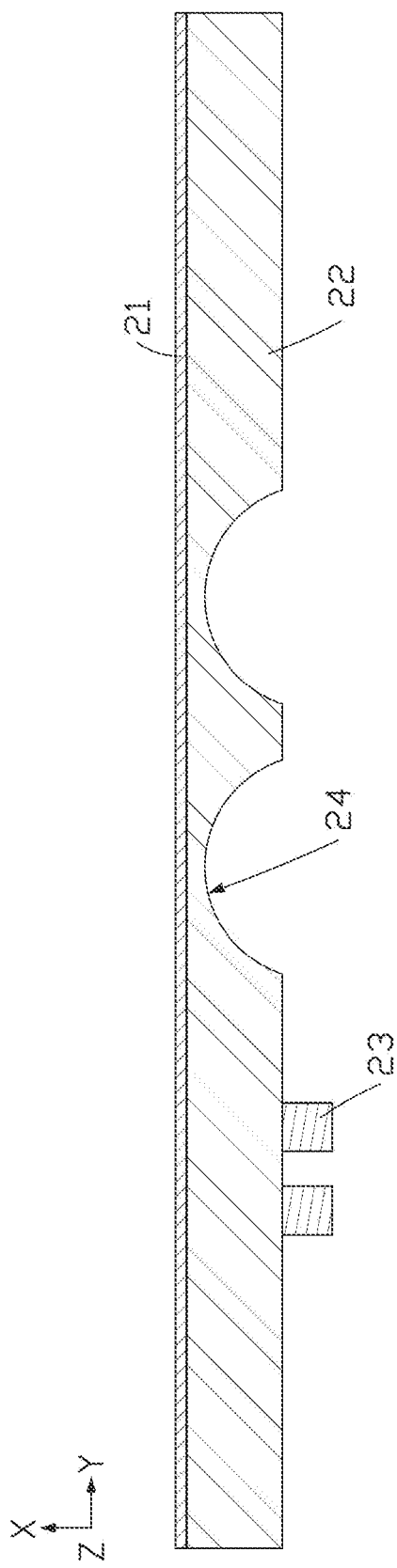
FIG. 11 is a cross-sectional view illustrating a blind groove being defined in the second copper-clad substrate in FIG. 10 to obtain a substrate unit.

At block S11, referring to FIG. 11, at least one blind groove 24 is formed on the surface of the second base layer 22 away from the third metal layer 21. In the second direction Y, the blind groove 24 is spaced from the connecting post 23, that is, the blind groove 24 is formed in an area of the surface of the second base layer 22 besides the connecting post 23.

In at least one embodiment, the blind groove 24 may be formed by mechanical drilling or laser drilling. Along a cross-section parallel to the first direction X and the second direction Y, the blind groove 24 may be semicircular or square. In at least one embodiment, multiple blind grooves 24 are formed on the second base layer 22, and are spaced from each other in the second direction Y. Furthermore, the blind groove 24 does not extend through the entire second base layer 22 in the first direction X.

Figure 12:
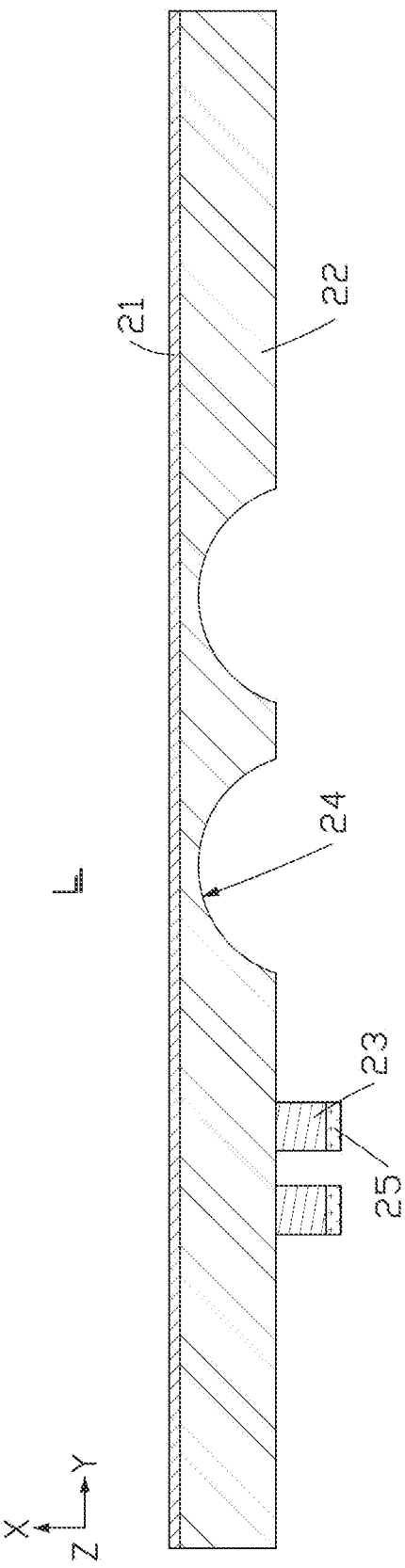
FIG. 12 is a cross-sectional view illustrating a connecting material being formed on the connecting post in FIG. 11.

At block S12, referring to FIG. 12, a connecting material 25 is formed on an end of the connecting post 23 away from the second base layer 22. Then, a substrate unit L is obtained.

In at least one embodiment, the connecting material 25 may include a conductive paste, such as a tin paste or a copper paste.

Figure 13:
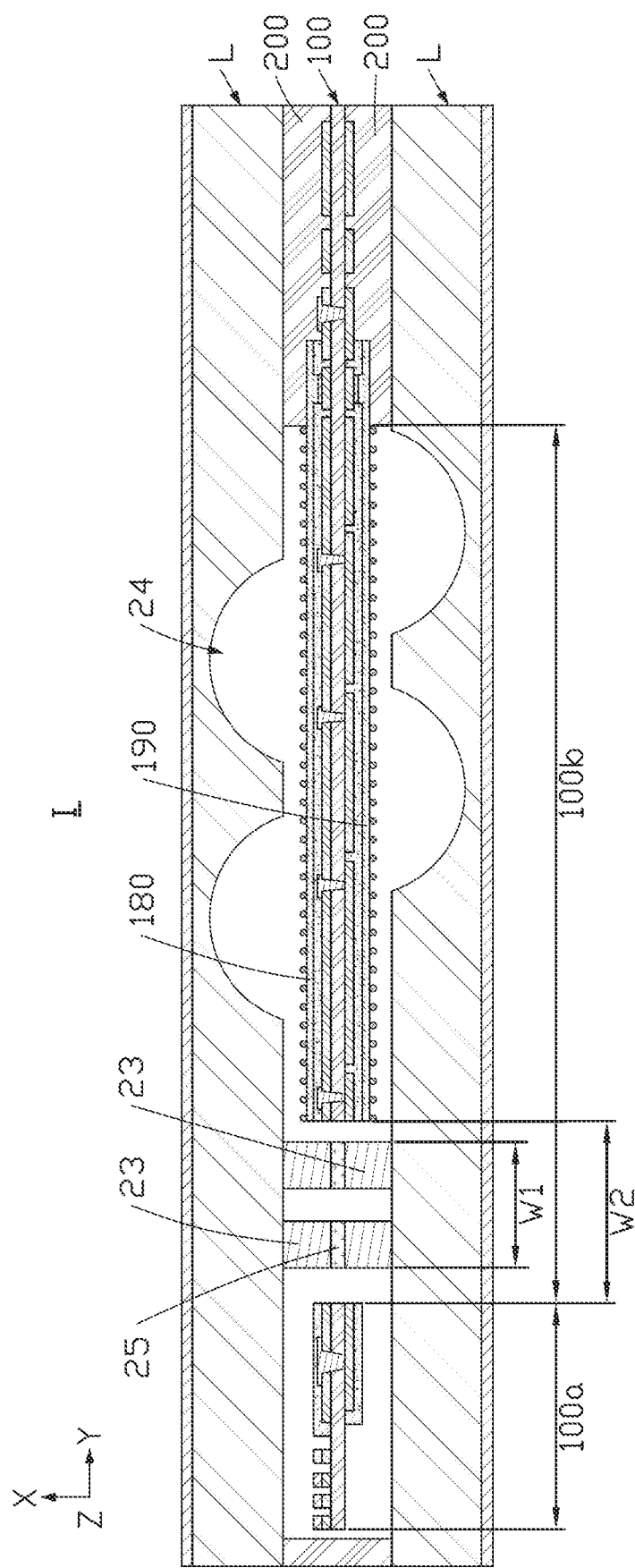
FIG. 13 is a cross-sectional view illustrating an adhesive layer and the substrate unit being formed on the flexible circuit board in FIG. 12.

At block S13, referring to FIG. 13, the substrate unit L, an adhesive layer 200, the flexible circuit board 100, another adhesive layer 200, and another substrate unit L are sequentially stacked. The connecting post 23 and the blind groove 24 of each substrate unit L face toward the flexible circuit board 100. Then, an intermediate body I is obtained.

Before the stacking process, the connecting area 100a of the flexible circuit board 100 may be shaped (for example, by pre-cutting) to obtain a desired shape. After the stacking process, each of the first conductive layer 180 and the second conductive layer 190 of the flexible circuit board 100 are exposed from the corresponding adhesive layer 200, that is, the adhesive layer 200 does not cover the first conductive layer 180 or the second conductive layer 190. The connecting area 100a of the flexible circuit board 100 is also exposed from the corresponding adhesive layer 200, that is, the adhesive layer 200 does not cover the connecting area 100a.

After the stacking process, the connecting post 23 of one substrate unit L extends through the through groove 101 of the flexible circuit board 100, and is aligned with the connecting post 23 of another substrate unit L. The blind grooves 24 of the two substrate units L are misaligned with each other in the second direction Y. An orthogonal projection of the blind groove 24 of each substrate unit L on the flexible circuit board 100 is located within the first conductive layer 180 or the second conductive layer 190.

When each substrate unit L includes multiple connecting posts 23, in the second direction Y, a distance W1 between outer sidewalls of the two outermost connecting posts 23 of each substrate unit L is smaller than a width W2 of the through groove 101 of the flexible circuit board 100. As such, the connecting posts 23 can slide in the through groove 101 along the second direction Y. When each substrate unit L only includes one connecting post 23, the width of the connecting post 23 in the second direction Y is less than the width W2 of the through groove 101.

At block S14, referring to FIG. 13, the intermediate body I is pressed, so that each adhesive layer 200 connects the corresponding substrate unit L to the flexible circuit board 100.

In at least one embodiment, the intermediate body I may also be heated during the pressing process, thereby increasing the connection strength between the substrate unit L and the flexible circuit board 100.

Figure 14:
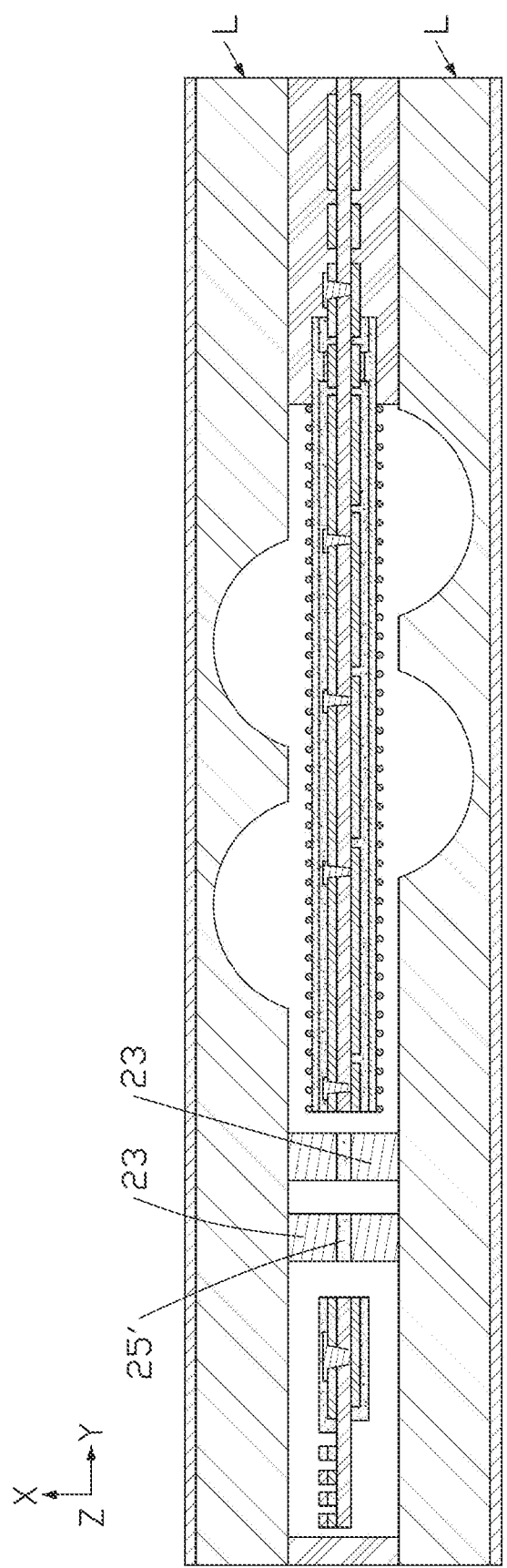
FIG. 14 is a cross-sectional view illustrating the structure in FIG. 13 being pressed.

At block S15, referring to FIG. 14, the connecting material 25 is solidified to obtain a connecting layer 25'. The connecting layer 25' connects the connecting posts 23 of different substrate units L together.

In at least one embodiment, the connecting material 25 (such as solder paste) may be solidified by ultraviolet light.

Figure 15:
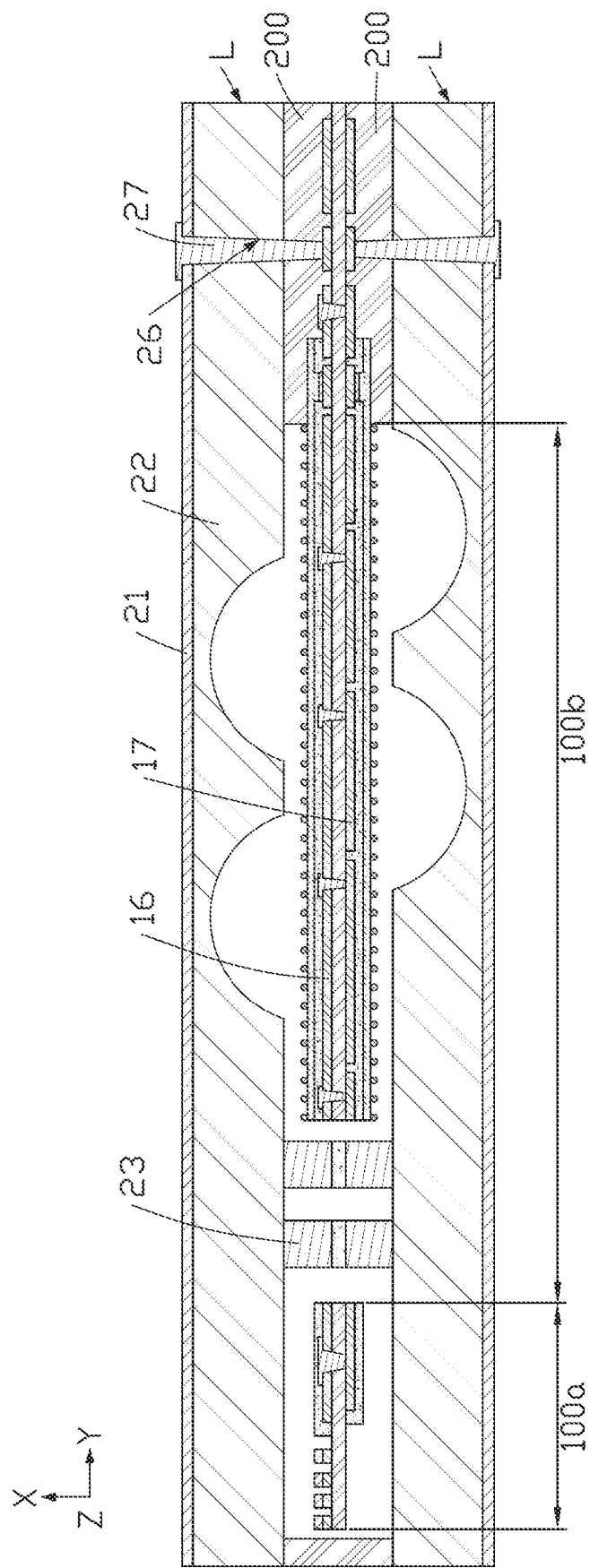
FIG. 15 is a cross-sectional view illustrating a second conductive portion being formed in the substrate unit in FIG. 14.

At block S16, referring to FIG. 15, a second blind hole 26 is defined in each substrate unit L. Metal is then electroplated in the second blind hole 26 to obtain a second conductive portion 27. The second conductive portion 27 is used to electrically connect the third metal layer 21 to the first inner wiring layer 16 or the second inner wiring layer 17.

In at least one embodiment, in the second direction Y, the stretchable area 100b is located between the connecting post 23 and the second conductive portion 27. The stretchable area 100b extends out of the adhesive layer 200 in the second direction Y, that is, the stretchable area 100b is not covered by the adhesive layer 200. The second blind hole 26 extends through the third metal layer 21, the second base layer 22, and the adhesive layer 200. The first inner wiring layer 16 or the second inner wiring layer 17 serves as a bottom of the second blind hole 26. The second conductive portion 27 may be made of copper.

In at least one embodiment, the second blind hole 26 may be formed by mechanical drilling or laser drilling.

Figure 16:
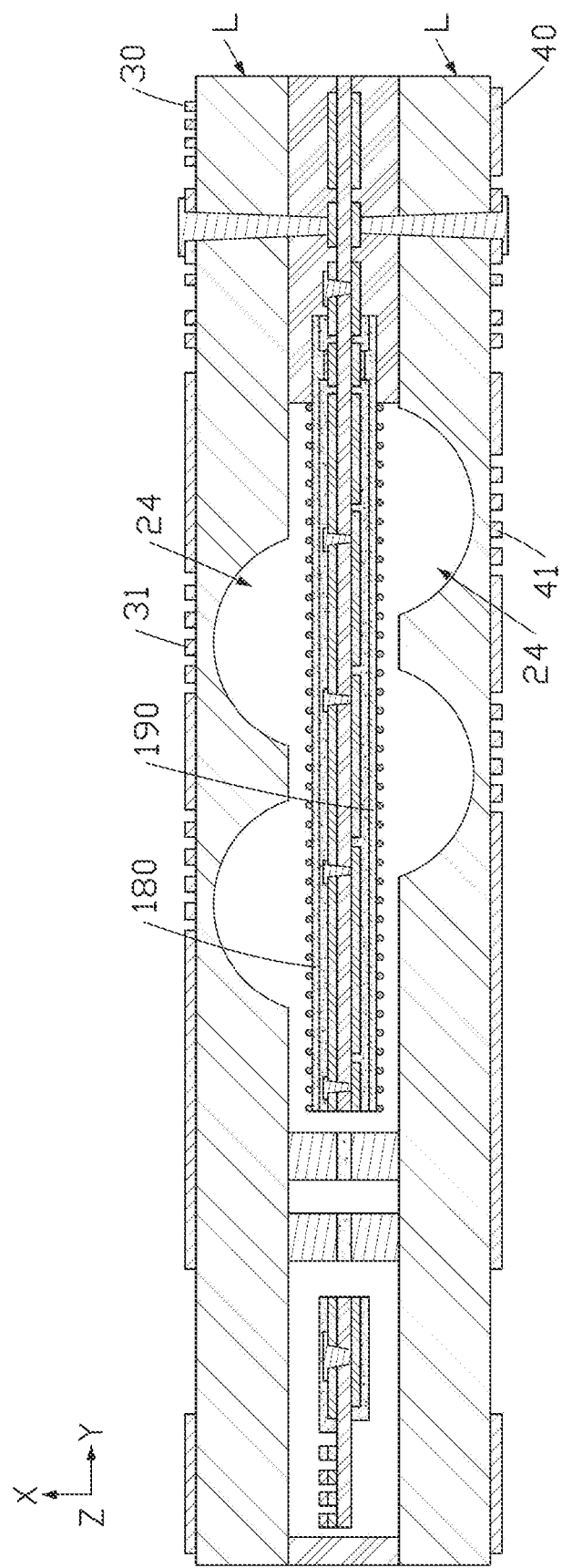
FIG. 16 is a cross-sectional view illustrating another metal layer of the substrate unit in FIG. 15 being etched to obtain an outer wiring layer.

At block S17, referring to FIG. 16, the third metal layer 21 of each substrate unit L is etched to obtain a first outer wiring layer 30 and a second outer wiring layer 40. The first outer wiring layer 30 is located on one side of the first conductive layer 180 and includes at least one first coil 31. The second outer wiring layer 40 is located on one side of the second conductive layer 190 and includes at least one second coil 41.

In at least one embodiment, the first outer wiring layer 30 may include multiple first coils 31. Each first coil 31 corresponds to one blind groove 24 of the corresponding substrate unit L in the first direction X. The second outer wiring layer 40 may include multiple second coil 41. Each second coil 41 corresponds to one blind groove 24 of the corresponding substrate unit L in the first direction X. The third metal layer 21 may be etched by an exposure and development process.

Figure 17:
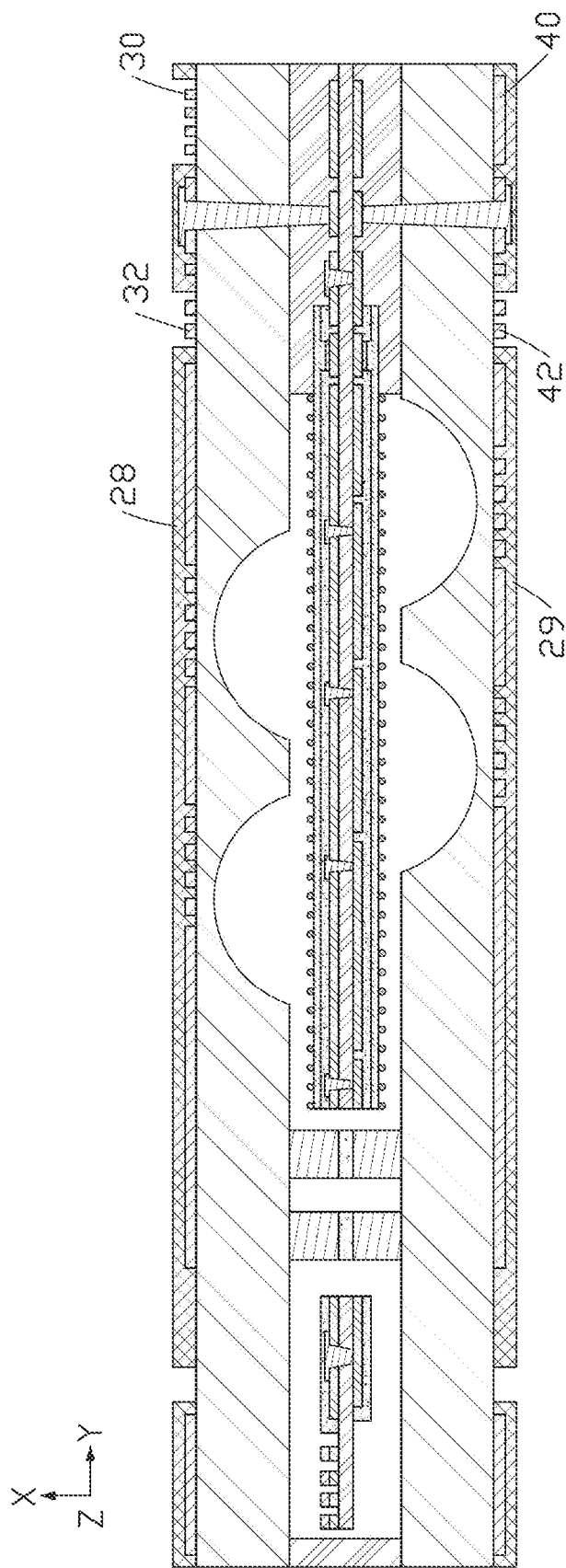
FIG. 17 is a cross-sectional view illustrating a cover layer being formed on the outer wiring layer in FIG. 16.

At block S18, referring to FIG. 17, a third cover layer 28 is formed on the first outer wiring layer 30. A fourth cover layer 29 is formed on the second outer wiring layer 40. The first outer wiring layer 30 is partially exposed from the third cover layer 28 to form a first pad 32. The second outer wiring layer 40 is partially exposed from the fourth cover layer 29 to form a second pad 42.

In at least one embodiment, each of the third cover layer 28 and the fourth cover layer 29 may be a cover film (CVL) or a solder mask layer.

Figure 18:
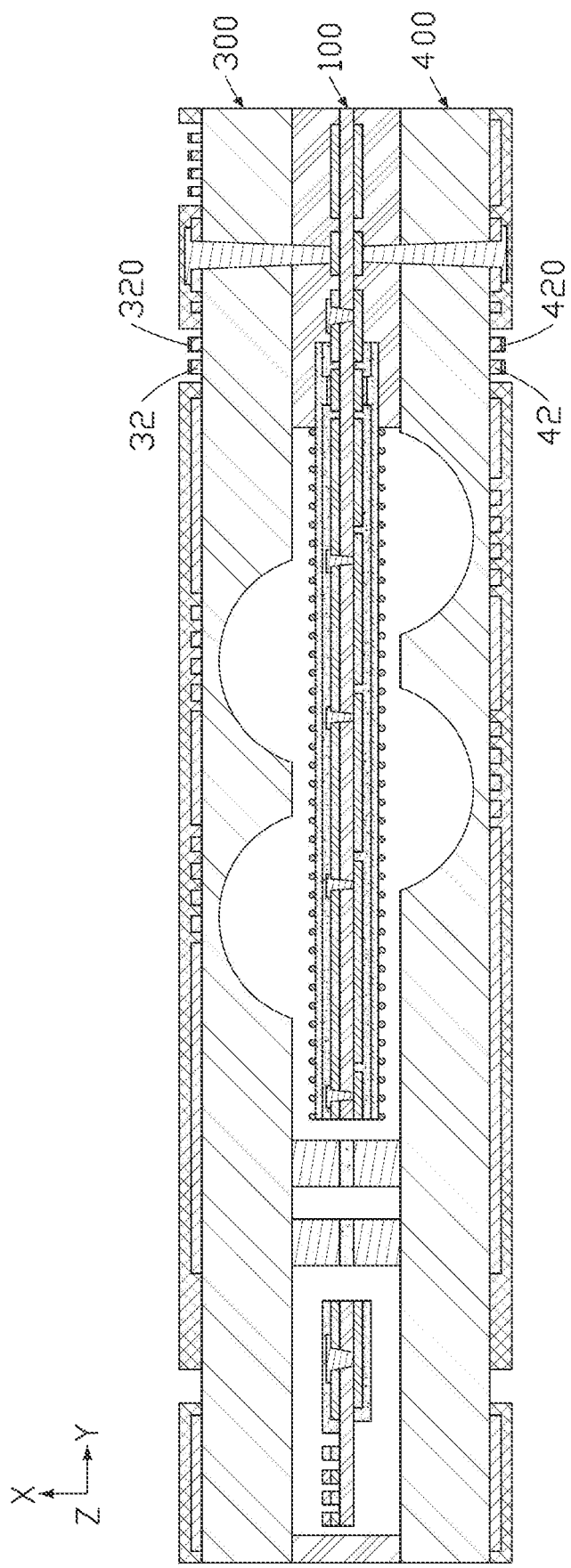
FIG. 18 is a cross-sectional view illustrating a protective layer formed on the outer wiring layer in FIG. 17 to obtain an outer circuit board.

At block S19, referring to FIG. 18, a surface treatment is performed on the first pad 32 to form a second protective layer 320. A surface treatment is performed on the second pad 42 to form a third protective layer 420. Then, a first outer circuit board 300 and a second outer circuit board 400 are formed on two opposite surfaces of the flexible circuit board 100.

The second protective layer 320 is used to avoid surface oxidation happened on the first pad 32. The third protective layer 420 is used to avoid surface oxidation happened on the second pad 42. The surface treatment may be performed by chemical plating of gold or plating. In other embodiments, the second protective layer 320 or the third protective layer 420 may also be an organic solder protective layer (OSP).

In the above embodiment, the first outer circuit board 300 includes one wiring layer, that is, the first outer wiring layer 30. The second outer circuit board 400 includes one wiring layer, that is, the second outer wiring layer 40. In other embodiments, the number of wiring layers included in the first outer circuit board 300 or the second outer circuit board 400 may also be varied. For example, the first outer circuit board 300 may further include a wiring layer formed on the surface of the second base layer 22 having the blind groove 24. For example, after etching the third metal layer 21 to obtain a wiring layer, other wiring layers may be further formed on the wiring layer through a build-up process. The outermost wiring layer is the first outer wiring layer 30. The number of wiring layers included in the first outer circuit board 300 may be the same as or different from that included in the second outer circuit board 400.

Figure 19:
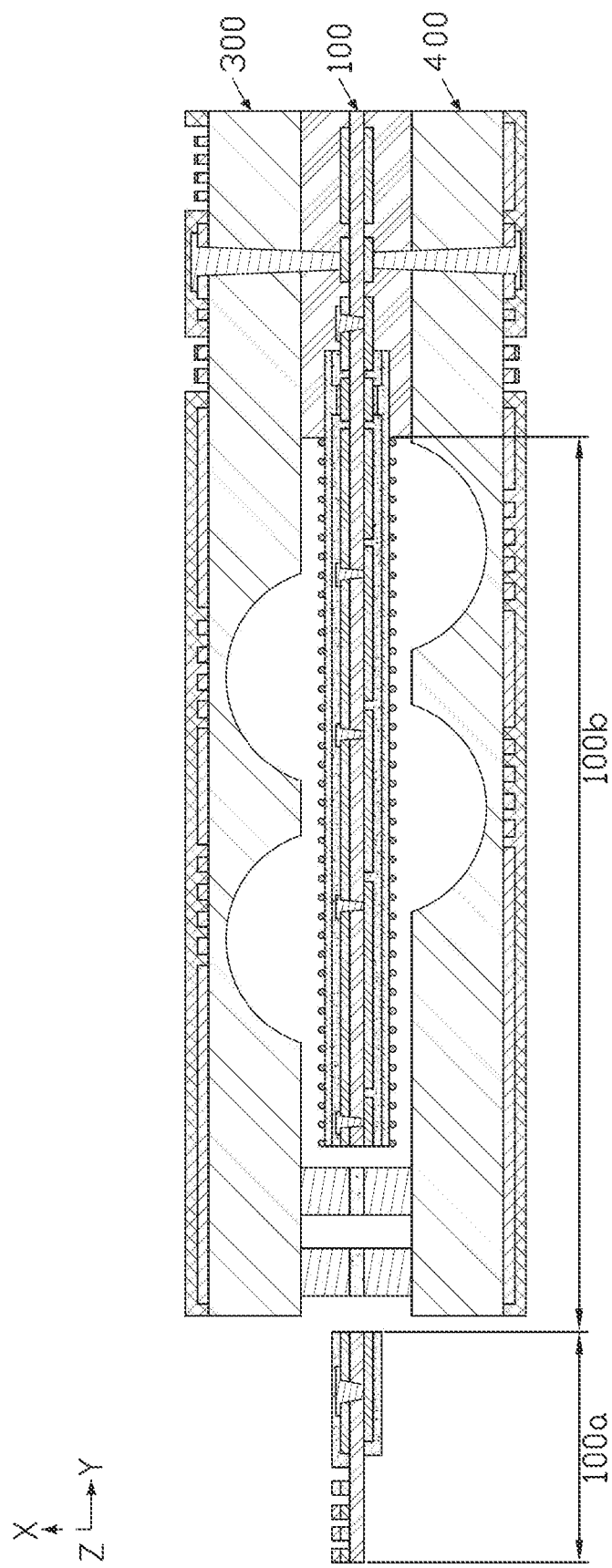
FIG. 19 is a cross-sectional view illustrating the outer circuit board in FIG. 18 being partially removed.

At block S20, referring to FIG. 19, the first outer circuit board 300 and the second outer circuit board 400, which are located on two opposite sides of the connecting area 100a of the flexible circuit board 100, are removed. Thus, the connecting area 100a is exposed. Moreover, the connecting area 100a of the flexible circuit board 100 extends out of the first outer circuit board 300 and the second outer circuit board 400 in the second direction Y.

Figure 20:
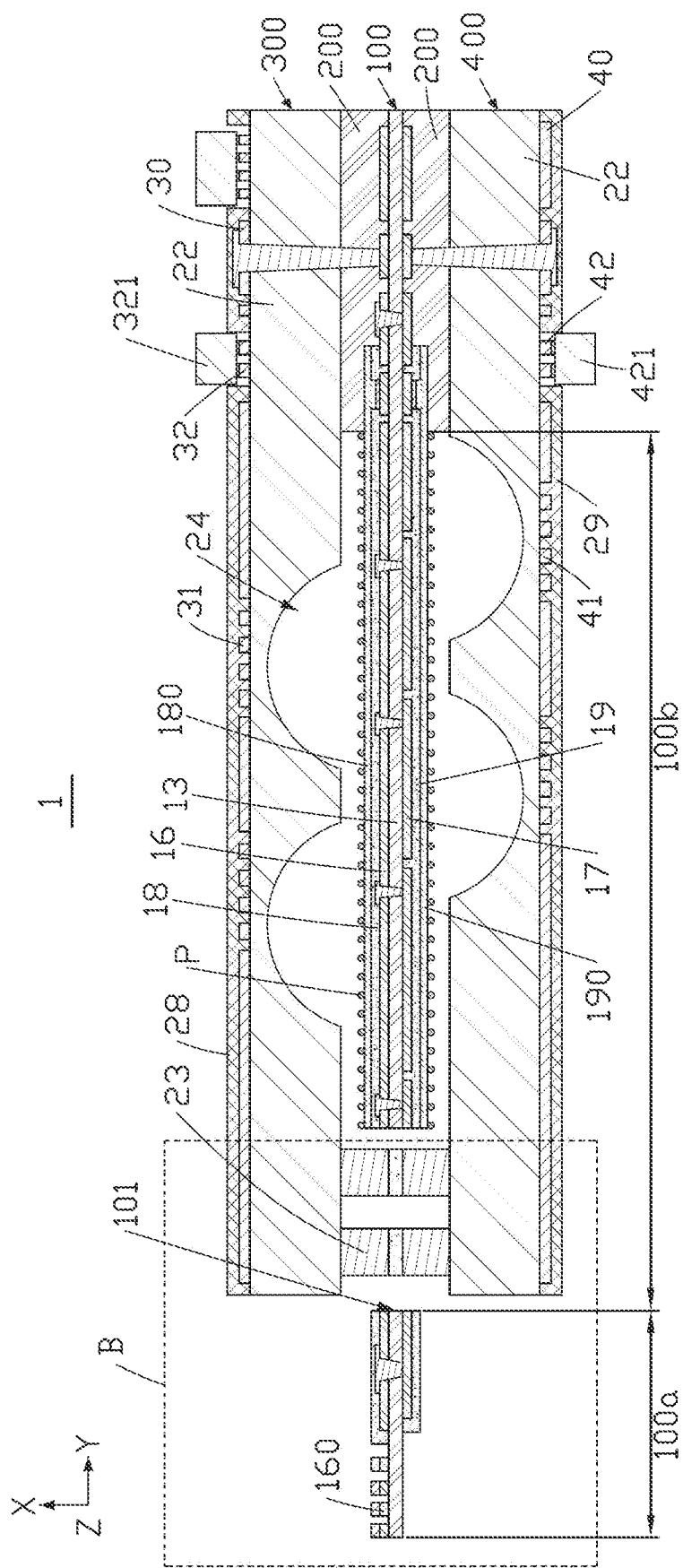
FIG. 20 is a cross-sectional view illustrating electronic components being mounted on the outer wiring layer in FIG. 19 to obtain a circuit board assembly.

At block S21, referring to FIG. 20, a first electronic component 321 is mounted on the first pad 32. A second electronic component 421 is mounted on the second pad 42. Then, the circuit board assembly 1 is obtained.

Figure 21:
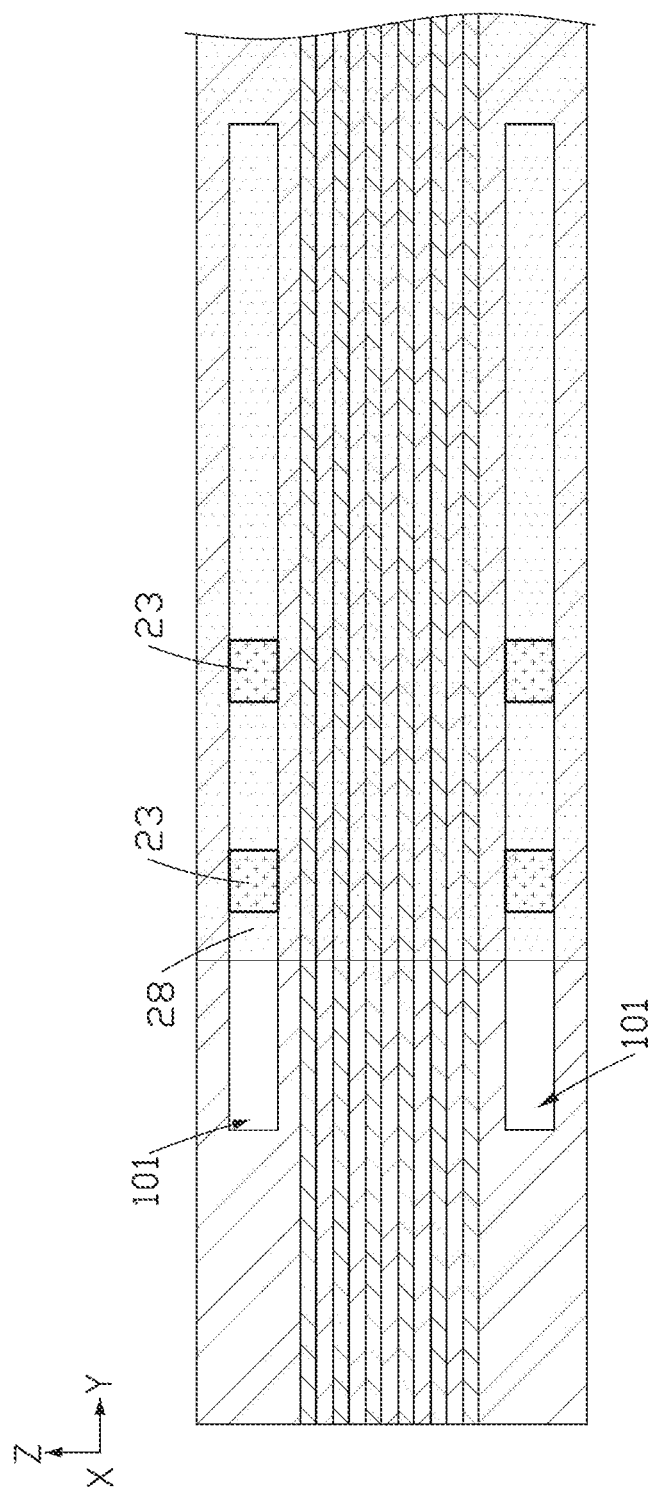
FIG. 21 is a top view illustrating a portion B of the circuit board assembly in FIG. 20.

FIG. 21 illustrates a top view of the portion of the circuit board assembly 1 labeled by B in FIG. 20. As shown in FIG. 21, two through grooves 101 are defined in the flexible circuit board 100. The two through grooves 101 are spaced from each other in a third direction Z perpendicular to each of the first direction X and the second direction Y. Each through groove 101 is in a long-strip shape that extends in the second direction Y. Two connecting posts 23 are slidably arranged in each through groove 101.

Figure 22:
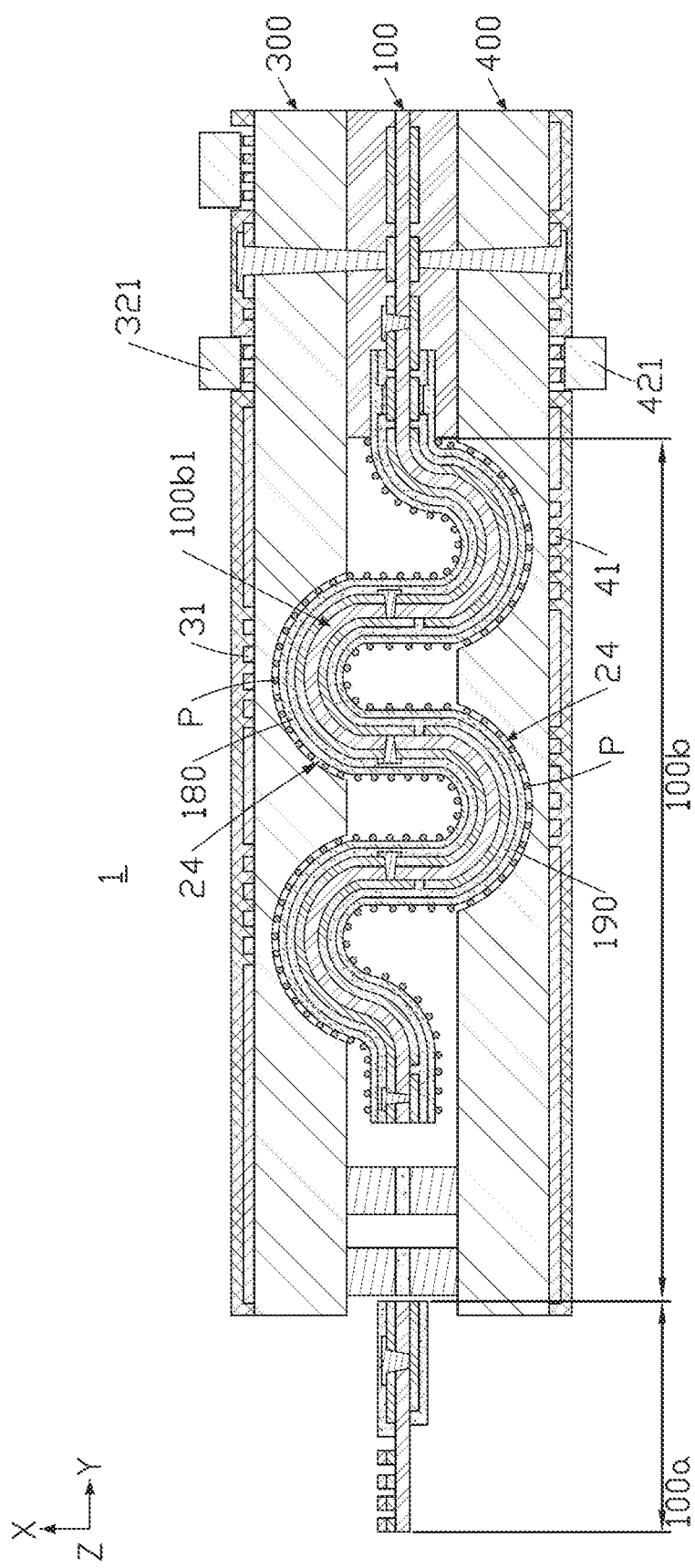
FIG. 22 is a cross-sectional view illustrating the circuit board assembly in FIG. 20 being retracted.

In use, as shown in FIG. 22, the first outer wiring layer 30 is energized, which then energizes the first coil 31. After being energized, the first coil 31 generates a magnetic field, which attracts the magnetic particles P on the first conductive layer 180 to move towards the first coil 31. Moreover, the magnetic particles P on the first conductive layer 180 will drive the corresponding stretchable area 100b to move, thereby causing the stretchable area 100b to be bent into at least one bent portion 100b1. Each bent portion 100b1 is then received in the corresponding blind groove 24 of the first outer circuit board 300. Similarly, the second outer wiring layer 40 is energized, which then energizes the second coil 41. After being energized, the second coil 41 generates a magnetic field, which attracts the magnetic particles P on the second conductive layer 190 to move towards the second coil 41. Moreover, the magnetic particles P on the second conductive layer 190 will drive the corresponding stretchable area 100b to move, thereby causing the stretchable area 100b to be bent into at least one bent portion 100b1. Each bent portion 100b1 is then received in the corresponding blind groove 24 of the second outer circuit board 400. That is, the stretchable area 100b undergoes deformation and forms multiple bent portions 100b1 that are sequentially connected to each other in the second direction Y. Two adjacent bent portions 100b1 have opposite bending directions. Due to the stretchable area 100b are bent in opposite directions, the connecting area 100a is presented as being retracted in the second direction Y, that is, the length of the connecting area 100a extending out of the first outer circuit board 300 and the second outer circuit board 400 becomes less or even be zero.

As shown in FIG. 20, when the first outer wiring layer 30 and the second outer wiring layer 40 are stopped being energized, the first coil 31 and the second coil 41 are also stopped energized. The magnetic field disappears, and the stretchable area 100b returns to its original shape. Therefore, the connecting area 100a is presented as being extended in the second direction Y, that is, the length of the connecting area 100a extending out of the first outer circuit board 300 and the second outer circuit board 400 becomes larger. Therefore, the circuit board assembly 1 of the present application is stretchable. Thus, the circuit board assembly 1 can be used to connect to a scroll display screen, which can cause the rollable display screen to be stretched.

During the above stretching process, the connecting post 23 can slide back and forth in the through groove 101, thereby playing a guiding role along the second direction Y. Thus, the flexible circuit board 100 can be stretched in the second direction Y with the cooperation of the connecting post 23 and the through groove 101. In addition, the first conductive layer 180 and the second conductive layer 190 can provide electromagnetic shielding purpose, which shield interference signals generated by the first coil 31 and the second coil 41. Thus, the above interference signals will not affect the normal operation of the first inner wiring layer 16 and the second inner wiring layer 17. In other embodiments, the connecting post 23 and the through groove 101 may also be omitted. The first conductive layer 180 and the second conductive layer 190 may also be omitted.

In at least one embodiment, multiple first coils 31 of the first outer wiring layer 30 can be independently controlled, so that each first coil 31 can be independently energized. Similarly, multiple second coils 41 of the second outer wiring layer 40 can be independently controlled. By controlling the number of coils being energized, the number of bent portions 100b1 formed in the flexible circuit board 100 can be controlled. Therefore, the specific length of the flexible circuit board 100 during the stretching process can be adjusted at multiple levels according to actual needs, thereby improving the degree of freedom during the stretching process.

A circuit board assembly 2 is also provided in another embodiment of the present application. Differences between the methods for manufacturing the circuit board assemblies 1 and 2 are that after obtaining the flexible circuit board 100 at block S5, the procedure goes to block S22.

Figure 23:
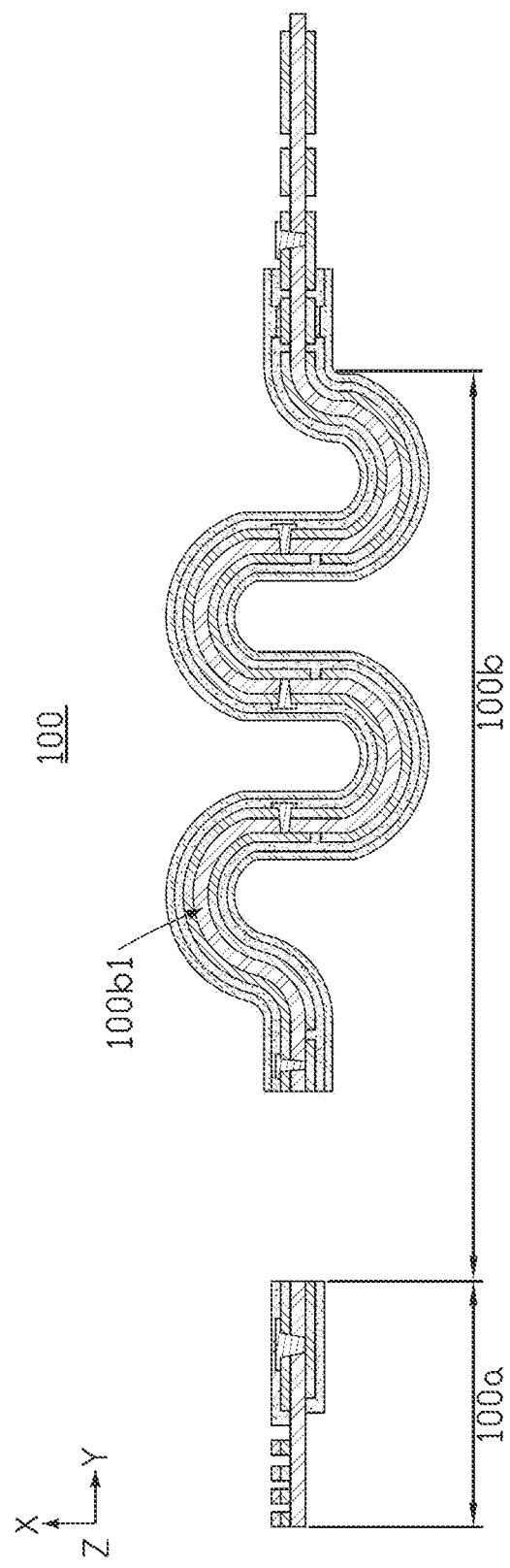
FIG. 23 is a cross-sectional view illustrating a flexible circuit board according to another embodiment of the present application.

At block S22, referring to FIG. 23, the stretchable area 100b is shaped into a curved structure through heat setting.

After the shaping process, the stretchable area 100b includes multiple bent portions 100b1 is that are sequentially connected in the second direction Y. The bending directions of two adjacent bent portions 100b1 are opposite to each other.

Figure 24:
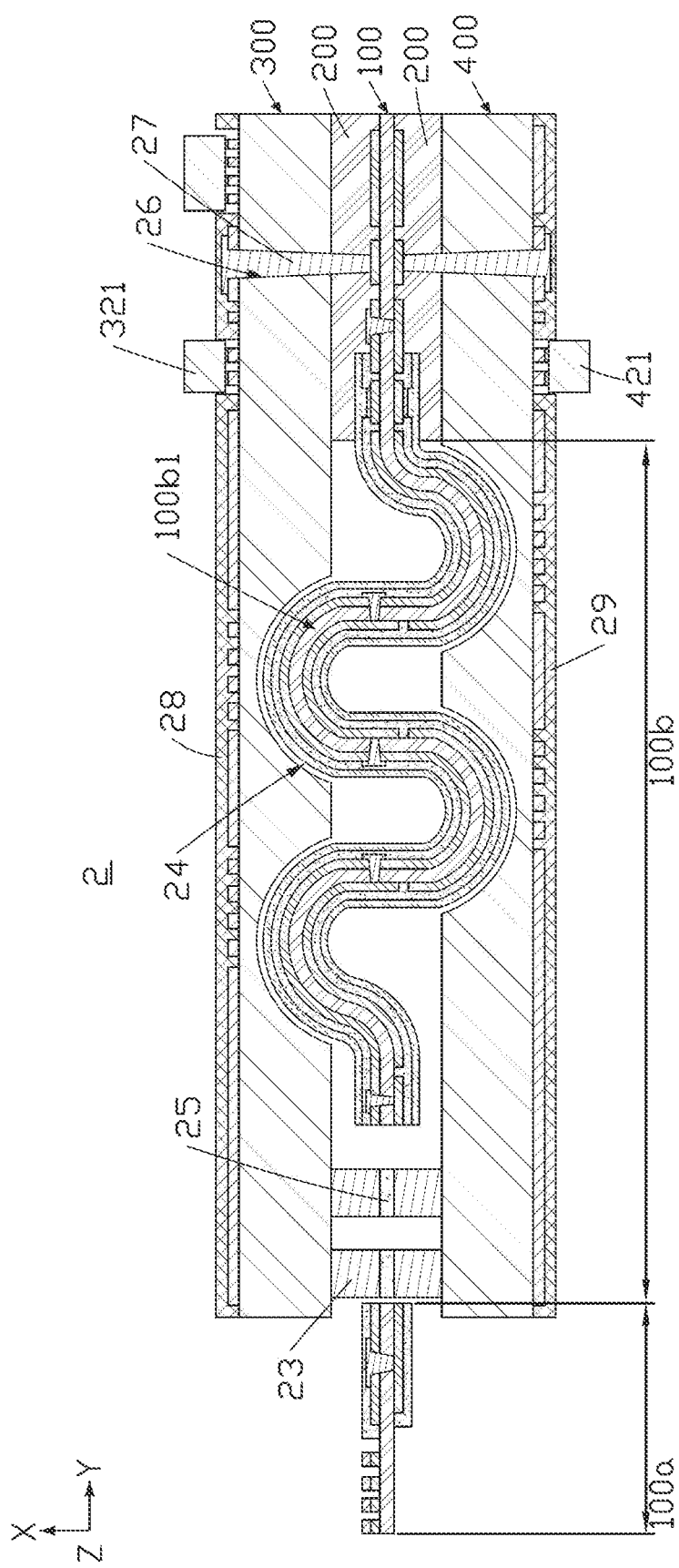
FIG. 24 is a cross-sectional view illustrating a circuit board assembly manufactured by the flexible circuit board in FIG. 23.

At block S23, referring to FIG. 24, one substrate unit (not shown), one adhesive layer 200, the flexible circuit board 100, another adhesive layer 200, and another substrate unit are sequentially stacked, thereby causing each bent portions 100b is of the stretchable area 100b to be received in one blind groove 24 of the corresponding substrate unit.

Then, processes such as pressing, solidifying the connecting material 25, defining the second blind hole 26 and electroplating metal therein, etching the third metal layer, forming the third cover layer 28 and the fourth cover layer 29, performing the surface treatment, partially removing the first outer circuit board 300 and the second outer circuit board 400, installing the first electronic component 321 and the second electronic component 421, are sequentially carried out to obtain the circuit board assembly 2.

At this time, when an external force pulls the connecting area 100a of the flexible circuit board 100, the stretchable area 100b can be stretched under the external force, thereby causing the connecting area 100a to further extend in the second direction Y to achieve the extending purpose. When the external force is removed, the stretchable area 100b returns to its initial state to achieve the retracting purpose.

Referring to FIG. 20, a circuit board assembly 1, which may be manufactured by the above method, is also provided according to an embodiment of the present application. The circuit board assembly 1 includes a first outer circuit board 300, an adhesive layer 200, a flexible circuit board 100, another adhesive layer 200, and a second outer circuit board 400 that are sequentially stacked in the first direction X.

The flexible circuit board 100 includes a first cover layer 18, a first inner wiring layer 16, a first base layer 13, a second inner wiring layer 17, and a second cover layer 19 that are sequentially stacked in the first direction X. The flexible circuit board 100 includes a connecting area 100a and a stretchable area 100b arranged in a second direction Y perpendicular to the first direction X. The first inner wiring layer 16 within the connecting area 100a includes an electrical connecting portion 160. The electrical connecting portion 160 is exposed from the first outer circuit board 300 and the second outer circuit board 400. The stretchable area 100b can be deformed into multiple bent portions 100b1 that are sequentially connected in the second direction Y (referring to FIG. 22). When the stretchable area 100b deforms or returns to its original shape, the stretchable area 100b can cause the electrical connecting portion 160 to extend and retract in the second direction Y compared to the first outer circuit board 300 and the second outer circuit board 400.

The first outer circuit board 300 includes a second base layer 22 and a first outer wiring layer 30 stacked in the first direction X. The second base layer 22 is located between the first outer wiring layer 30 and the first inner wiring layer 16. The second outer circuit board 400 includes another second base layer 22 and a second outer wiring layer 40 stacked in the first direction X. The second base layer 22 is located between the second outer wiring layer 40 and the second inner wiring layer 17. The surface of each second base layer 22 away from the first outer wiring layer 30 or the second outer wiring layer 40 defines at least one blind groove 24. Each blind groove 24 is used to receive one bent portion 100b1. In the embodiment, the first outer circuit board 300 includes one wiring layer, that is, the first outer wiring layer 30. The second outer circuit board 400 includes one wiring layer, that is, the second outer wiring layer 40. In other embodiments, the number of wiring layer(s) of the first outer circuit board 300 or the second outer circuit board 400 may also be varied. For example, the first outer circuit board 300 may also have a wiring layer on the surface of the second base layer 22 having the blind groove 24. That is, the first outer circuit board 300 may be a double-sided circuit board. In other embodiments, the blind groove 24 may be omitted.

In at least one embodiment, the flexible circuit board 100 further includes a first conductive layer 180 adhered to the first cover layer 18 and a second conductive layer 190 adhered to the second cover layer 19. The first conductive layer 180 and the second cover layer 19 correspond to the stretchable area 100b of the flexible circuit board 100. Multiple magnetic particles P are adhered to each of the first conductive layer 180 and the second conductive layer 190.

At least one through groove 101 is defined in the flexible circuit board 100. The through groove 101 is at least partially located at the bent portions 100b1. Each through groove 101 extends through the first cover layer 18, the first inner wiring layer 16, the first base layer 13, the second inner wiring layer 17, and the second cover layer 19.

The first outer wiring layer 30 is located on the first conductive layer 180, and includes at least one first coil 31 and at least one first pad 32. The first pad 32 is exposed from the third cover layer 28. Each first coil 31 corresponds to one blind groove 24 of the first outer circuit board 300 in the first direction X. At least one connecting post 23 is formed on the surface of the second base layer 22 away from the first outer wiring layer 30. The blind groove 24 is formed on the area of the surface of the second base layer 22 besides the connecting post 23.

The second outer wiring layer 40 is located on the second conductive layer 190, and includes at least one second coil 41 and at least one second pad 42. The second pad 42 is exposed from the fourth cover layer 29. Each second coil 41 corresponds to blind groove 24 of the second outer circuit board 400 in the first direction X. At least one connecting post 23 is formed on the surface of the second base layer 22 away from the second outer wiring layer 40. The blind groove 24 is formed on the area of the surface of the second base layer 22 besides the connecting post 23.

The circuit board assembly 1 may further include a first electronic component 321 and a second electronic component 421. The first electronic element 321 is installed on the first pad 32, and the second electronic element 421 is installed on the second pad 42. Referring to FIG. 22, after being energized, the first coil 31 generates a magnetic field, which attracts the magnetic particles P on the first conductive layer 180 to move towards the first coil 31. Moreover, the magnetic particles P on the first conductive layer 180 drives the stretchable area 100b to move, causing the stretchable area 100b to bend into the bent portions 100b1. Each bent portion 100b1 is received in the corresponding blind groove 24 on the first outer circuit board 300. After being electrified, the second coil 41 generates a magnetic field, which attracts the magnetic particles P on the second conductive layer 190 to move towards the second coil 41. Moreover, the magnetic particles P on the second conductive layer 190 drives the stretchable area 100b to move, thereby causing the stretchable area 100b to be bent into bent portion 100b1. Each bent portion 100b1 is received in the corresponding blind groove 24 of the second outer circuit board 400.

In other embodiments as shown in FIG. 24, the stretchable area 100b of the circuit board assembly 2 is a bent structure formed by heat setting. The bent structure includes multiple bent portions 100b1 sequentially connected in the second direction Y. The bending directions of two adjacent bent portions 100b1 are opposite to each other. Each bent portion 100b1 is received in the corresponding blind groove 24 of the first outer circuit board 300 or the second outer circuit board 400.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a circuit board assembly, comprising:
providing a flexible circuit board, wherein the flexible circuit board comprises a first base layer and an inner wiring layer formed on the first base layer, the flexible circuit board is divided into a connecting area and a stretchable area connected to the connecting area, the inner wiring layer within the connecting area comprises an electrical connecting portion, and the stretchable area is configured to deform into at least one bent portion; and
forming an outer circuit board on the inner wiring layer, causing the electrical connecting portion to be exposed from the outer circuit board, wherein the at least one bent portion is configured to cause the electrical connecting portion to stretch relative to the outer circuit board, the outer circuit board comprises a second base layer and an outer wiring layer formed on the second base layer, the second base layer is located between the outer wiring layer and the inner wiring layer, a surface of the second base layer away from the outer wiring layer defines at least one blind groove, and the at least one blind groove is configured to receive the at least one bent portion.

2. The method of claim 1, wherein before forming the outer circuit board, the method further comprises:
forming a plurality of magnetic particles on the inner wiring layer within the stretchable area, and
forming the outer circuit board further comprises:
providing at least one coil in the outer wiring layer, wherein the at least one blind groove corresponds to the at least one coil, the at least one coil is configured to generate a magnetic field when energized, and the magnetic field is configured to adsorb the plurality of magnetic particles to move toward the at least one coil, thereby causing the stretchable area to deform into the at least one bent portion.

3. The method of claim 2, wherein before forming the plurality of magnetic particles, the method further comprises:
adhering a conductive layer to the inner wiring layer within the stretchable area, wherein the plurality of magnetic particles is adhered to the conductive layer.

4. The method of claim 2, wherein before forming the outer circuit board, the method further comprises:
defining a through groove in the flexible circuit board, wherein the through groove is at least partially located at the at least one bent portion; and
forming a connecting post on the surface of the second base layer away from the outer wiring layer, wherein after forming the outer wiring board, the connecting post is slidably arranged in the through groove.

5. The method of claim 1, wherein before forming the outer circuit board, the method further comprises:
shaping a portion of the flexible circuit board into the at least one bent portion by heat setting, wherein after forming the outer circuit board, the at least one bent portion is received in the at least one blind groove.

6. The method of claim 1, wherein the outer wiring layer is provided with a pad, the method further comprises:
mounting an electronic component on the pad.

7. A circuit board assembly comprising:
a flexible circuit board comprising a first base layer and an inner wiring layer formed on the first base layer, wherein the flexible circuit board is divided into a connecting area and a stretchable area connected to the connecting area, the inner wiring layer within the connecting area comprises an electrical connecting portion, and the stretchable area is configured to deform into at least one bent portion; and
an outer circuit board formed on the inner wiring layer, and the electrical connecting portion being exposed from the outer circuit board, wherein the at least one bent portion is configured to cause the electrical connecting portion to stretch relative to the outer circuit board, the outer circuit board comprises a second base layer and an outer wiring layer formed on the second base layer, the second base layer is located between the outer wiring layer and the inner wiring layer, a surface of the second base layer away from the outer wiring layer defines at least one blind groove, and the at least one blind groove is configured to receive the at least one bent portion.

8. The circuit board assembly of claim 7, wherein the stretchable area comprises a bent structure, the bent structure comprises the at least one bent portion, and the at least one bent portion is received in the at least one blind groove.

9. The circuit board assembly of claim 7, wherein the flexible circuit board defines a through groove, the through groove is at least partially located at the at least one bent portion, the outer circuit board further comprises a connecting post located on the surface of the second base layer away from the outer wiring layer, and the connecting post is slidably arranged in the through groove.

10. The circuit board assembly of claim 7, wherein the flexible circuit board further comprises a plurality of magnetic particles formed on the inner wiring layer within the stretchable area, the outer wiring layer comprises at least one coil corresponding to the at least one blind groove, the at least one coil is configured to generate a magnetic field when energized, and the magnetic field is configured to adsorb the plurality of magnetic particles to move toward the at least one coil, thereby causing the stretchable area to deform into the at least one bent portion.

11. The circuit board assembly of claim 10, wherein the flexible circuit board further comprises a conductive layer adhered to the inner wiring layer within the stretchable area, and the plurality of magnetic particles is adhered to the conductive layer.

12. The circuit board assembly of claim 10, wherein the flexible circuit board defines a through groove, the through groove is at least partially located at the at least one bent portion, the outer circuit board further comprises a connecting post located on the surface of the second base layer away from the outer wiring layer, and the connecting post is slidably arranged in the through groove.

13. The circuit board assembly of claim 10, wherein the magnetic field is configured to cause the stretchable area to deform into a plurality of bent portions, which comprises the at least one bent portion.

14. The circuit board assembly of claim 13, wherein the at least one coil comprises a plurality of coils independent from each other.

15. The circuit board assembly of claim 7, wherein the outer wiring layer comprises a pad, the outer circuit board further comprises an electronic component mounted on the pad.

16. A circuit board assembly comprising:
a flexible circuit board comprising a first base layer and an inner wiring layer formed on the first base layer, wherein the flexible circuit board is divided into a connecting area and a stretchable area connected to the connecting area, the inner wiring layer within the connecting area comprises an electrical connecting portion, and the flexible circuit board further comprises a plurality of magnetic particles formed the inner wiring layer within the stretchable area; and
an outer circuit board formed on the inner wiring layer, and the electrical connecting portion being exposed from the outer circuit board, wherein the outer circuit board comprises a second base layer and an outer wiring layer formed on the second base layer, the second base layer is located between the outer wiring layer and the inner wiring layer, the outer wiring layer comprises at least one coil, the at least one coil is configured to generate a magnetic field when energized, and the magnetic field is configured to adsorb the plurality of magnetic particles to move toward the at least one coil, thereby causing the stretchable area to deform into at least one bent portion.

17. The circuit board assembly of claim 16, wherein a surface of the second base layer away from the outer wiring layer defines at least one blind groove, and the at least one blind groove is configured to receive the at least one bent portion.

18. The circuit board assembly of claim 16, wherein the flexible circuit board further comprises a conductive layer, the conductive layer is adhered to the inner wiring layer within the stretchable area, and the plurality of magnetic particles is adhered to the conductive layer.

19. The circuit board assembly of claim 16, wherein the flexible circuit board defines a through groove, the through groove is at least partially located at the at least one bent portion, the outer circuit board further comprises a connecting post located on a surface of the second base layer away from the outer wiring layer, and the connecting post is slidably arranged in the through groove.

20. The circuit board assembly of claim 16, wherein the magnetic field is configured to cause the stretchable area to bend into a plurality of bent portions, which comprises the at least one bent portion.

\* \* \* \* \*